(12) United States Patent
Xi (10) Patent No.: US 11,289,517 B2
(45) Date of Patent: Mar. 29, 2022

(54) ARRAY SUBSTRATE, METHOD OF MANUFACTURING THEREOF, AND DISPLAY PANEL

(71) Applicant: Shenzhen China Star Optoelectronics Semiconductor Display Technology Co., Ltd., Shenzhen (CN)

(72) Inventor: Suping Xi, Shenzhen (CN)

(73) Assignee: Shenzhen China Star Optoelectronics Sesicondusctor Display Technology Co., Ltd., Shenzhen (CN)

( * ) Notice: Subject to any disclaimer, the term of this patent is extended or adjusted under 35 U.S.C. 154(b) by 153 days.

(21) Appl. No.: 16/626,600

(22) PCT Filed: Dec. 4, 2019

(86) PCT No.: PCT/CN2019/122905
§ 371 (c)(1),
(2) Date: Dec. 26, 2019

(87) PCT Pub. No.: WO2021/082170
PCT Pub. Date: May 6, 2021

(65) Prior Publication Data
US 2021/0296369 A1    Sep. 23, 2021

(30) Foreign Application Priority Data
Oct. 28, 2019  (CN) .......................... 201911031657.3

(51) Int. Cl.
*H01L 27/00* (2006.01)
*H01L 29/00* (2006.01)
(Continued)

(52) U.S. Cl.
CPC ...... *H01L 27/1248* (2013.01); *H01L 27/1259* (2013.01); *H01L 29/7869* (2013.01); *H01L 29/78669* (2013.01)

(58) Field of Classification Search
CPC ............. H01L 27/1248; H01L 27/1259; H01L 27/3622; H01L 27/1225; H01L 27/326;
(Continued)

(56) References Cited

U.S. PATENT DOCUMENTS 7,947,981 B2 * 5/2011 Yamazaki ........... H01L 27/1233
257/59
8,932,894 B2 * 1/2015 Christophersen ..... H01L 31/115
438/57

(Continued)

FOREIGN PATENT DOCUMENTS

CN       206961832       2/2018
CN       107978610       5/2018

*Primary Examiner* — Nikolay K Yushin (57) ABSTRACT

An array substrate, a method of manufacturing thereof, and a display panel are provided. In the array substrate, a lesser thickness of an active layer in a GOA area achieves improved response time of thin film transistor in the GOA area, and a greater thickness of the active layer in a display area reduces diffusion of photons in the active layer, so as to decrease an influence of negative bias of thin film transistor in the display area. Additionally, different demands for characteristics of the array substrate in the display area and in the GOA area may be met, such that quality of the display panel may be improved.

20 Claims, 4 Drawing Sheets

(51) Int. Cl.
*H01L 27/12* (2006.01)
*H01L 29/786* (2006.01)

(58) Field of Classification Search
CPC ........... H01L 29/78669; H01L 29/7869; H01L 29/41733; H01L 29/42384; H01L 29/4908
See application file for complete search history.

(56) References Cited

U.S. PATENT DOCUMENTS

| | | | |
|---|---|---|---|
| 9,437,627 B2* | 9/2016 | Kao | H01L 29/78618 |
| 10,446,589 B2* | 10/2019 | Lou | H01L 29/66969 |
| 2008/0179597 A1* | 7/2008 | Yamazaki | H01L 27/12 |
| | | | 257/59 |
| 2010/0264502 A1* | 10/2010 | Christophersen | H01L 31/115 |
| | | | 257/429 |
| 2016/0172389 A1* | 6/2016 | Kao | H01L 29/78618 |
| | | | 257/66 |
| 2019/0165004 A1* | 5/2019 | Lou | H01L 27/124 |

* cited by examiner

ARRAY SUBSTRATE, METHOD OF MANUFACTURING THEREOF, AND DISPLAY PANEL

RELATED APPLICATIONS

This application is a National Phase of PCT Patent Application No. PCT/CN2019/122905 having International filing date of Dec. 4, 2019, which claims the benefit of priority of Chinese Patent Application No. 201911031657.3 filed on Oct. 28, 2019. The contents of the above applications are all incorporated by reference as if fully set forth herein in their entirety.

FIELD AND BACKGROUND OF THE INVENTION

The present invention relates to the field of display, and more particularly, to an array substrate, a method of manufacturing thereof, and a display panel.

The technology of gate driver on array (GOA, in which gate drivers are integrated on array substrates) has been widely used in panel designs, since it has advantages such as saving gate driving integrated circuits and achieving narrow frames.

In display areas of panels, due to limitation of aperture ratio, a width of black matrix is set within a certain range and cannot be increased. As a result, light which is incident on an edge of the black matrix irradiates onto the array substrates due to diffuse reflection and refraction. Since gate terminals of the array substrates in the display areas receive negative voltage for a long period of time, and the array substrates are often exposed to light, a generation of negative bias of thin film transistors is accelerated. In the GOA areas, due to a large area of the black matrix, there is a small possibility of light leakage. However, for achieving quick response time of the array substrates of the GOA areas, a thickness of active areas is attentively investigated. Accordingly, for improving display quality, it is important to reduce the negative bias of the array substrates in the display areas and improve the response time of the array substrates in the GOA areas.

Hence, in conventional display panels, the negative bias of the array substrates in the display areas shall be prevented, and the response time of the array substrates in the GOA areas shall be improved.

SUMMARY OF THE INVENTION

The present invention provides an array substrate, a method of manufacturing thereof, and a display panel, in order to solve the problems in the conventional display panels that the negative bias of the array substrate in the display area shall be avoided, and the response speed of the array substrate in the GO area array substrate shall be improved.

To solve the above problems, the technical solution of the present invention is provided as follows.

The present invention provides an array substrate including a display area and a GOA area, including:
 a substrate;
 an active layer formed on the substrate and patterned to form an active area; and
 a source drain layer formed on the active layer;
 in which a thickness of the active area in the display area is greater than a thickness of the active area in the GOA area.

In the array substrate provided in the present invention, the array substrate further includes a gate layer, a gate insulating layer, an etch stop layer, a passivation layer, and a planarization layer which are stacked on the substrate, in which the active layer is disposed between the gate insulating layer and the etch stop layer, and the source drain layer is disposed between the etch stop layer and the passivation layer.

In the array substrate provided in the present invention, a thickness of the array substrate in the display area is equal to a thickness of the array substrate in the GOA area.

In the array substrate provided in the present invention, a thickness of the passivation layer in the display area is less than a thickness of the passivation layer in the GOA area.

In the array substrate provided in the present invention, a thickness of the planarization layer in the display area is less than a thickness of the planarization layer in the GOA area.

In the array substrate provided in the present invention, the array substrate further includes a gate insulating layer, a gate layer, an interlayer insulation layer, a passivation layer, and a planarization layer which are stacked on the substrate, in which the active layer is disposed between the substrate and the gate insulating layer, and the source drain layer is disposed between the interlayer insulation layer and the passivation layer.

In the array substrate provided in the present invention, a thickness of the array substrate in the display area is equal to a thickness of the array substrate in the GOA area.

In the array substrate provided in the present invention, a thickness of the interlayer insulation layer in the display area is less than a thickness of the interlayer insulation layer in the GOA area.

In the array substrate provided in the present invention, a thickness of the passivation layer in the display area is less than a thickness of the passivation layer in the GOA area.

In the array substrate provided in the present invention, a thickness of the planarization layer in the display area is less than a thickness of the planarization layer in the GOA area.

In the array substrate provided in the present invention, in the GOA area, material of the active layer of the array substrate includes amorphous silicon or indium gallium zinc oxide.

Also, the present invention further provides a method of manufacturing an array substrate, including:
 providing a substrate;
 depositing a semiconductor active layer on the substrate; and
 patterning the semiconductor active layer to obtain an active area, in which a thickness of the active area in a display area is greater than a thickness of the active area in a GOA area.

In the manufacturing method of the present invention, the patterning the semiconductor active layer further includes patterning the semiconductor active layer by a half-tone lithography process.

In the manufacturing method of the present invention, the patterning the semiconductor active layer further includes patterning the semiconductor active layer by a gray-tone mask process.

Also, the present invention further provides a display panel including an array substrate, in which the array substrate includes a display area and a GOA area, and a thickness of an active layer in the display area is greater than a thickness of the active layer in the GOA area.

In the display panel of the present invention, the array substrate further includes a gate layer, a gate insulating layer, an etch stop layer, a passivation layer, and a planarization layer which are stacked on the substrate, in which the active layer is disposed between the gate insulating layer and the etch stop layer, and the source drain layer is disposed between the etch stop layer and the passivation layer.

In the display panel of the present invention, a thickness of the array substrate in the display area is equal to a thickness of the array substrate in the GOA area.

In the display panel of the present invention, a thickness of the passivation layer in the display area is less than a thickness of the passivation layer in the GOA area.

In the display panel of the present invention, the array substrate further includes a gate insulating layer, a gate layer, an interlayer insulation layer, a passivation layer, and a planarization layer which are stacked on the substrate, in which the active layer is disposed between the substrate and the gate insulating layer, and the source drain layer is disposed between the interlayer insulation layer and the passivation layer.

In the display panel of the present invention, a thickness of the array substrate in the display area is equal to a thickness of the array substrate in the GOA area.

The present invention provides an array substrate, a method of manufacturing thereof, and a display panel, in which the array substrate includes a display area and a GOA area, and in the array substrate, a thickness of an active layer in the display area (i.e., AA area) is greater than a thickness of the active layer in the GOA area. In the array substrate, the thicknesses of the active layer in the GOA area and in the display area are different; more specifically, a lesser thickness of the active layer in the GOA area achieves an improved response time of thin film transistor in the GOA area, and a greater thickness of the active layer in the display area reduces a diffusion of photons in the active layer, so as to decrease an influence of negative bias of thin film transistor in the display area. By the different thicknesses of the active layer in the GOA area and in the display area, different demands for characteristics of the array substrate in the display area and in the GOA area may be met, such that the quality of the display panel may be improved.

DESCRIPTION OF SPECIFIC EMBODIMENTS OF THE INVENTION

The embodiments are described in detail below with reference to the accompanying drawings and used for exemplifying the specific embodiments carrying out the present invention. Directional terms mentioned in this application, such as "up", "down", "forward", "backward", "left", "right", "inside", "outside", "side", etc., merely indicate the direction of the drawings. Therefore, the directional terms are used for illustrating and understanding of the present invention rather than limiting thereof. In the drawings, the components having similar structures are marked with the same reference numerals.

In view of a problem of serious power consumption of driving thin film transistor (TFT) in conventional micro-LED displays, the present invention provides a micro-LED chip to solve such problem.

Figure 1:
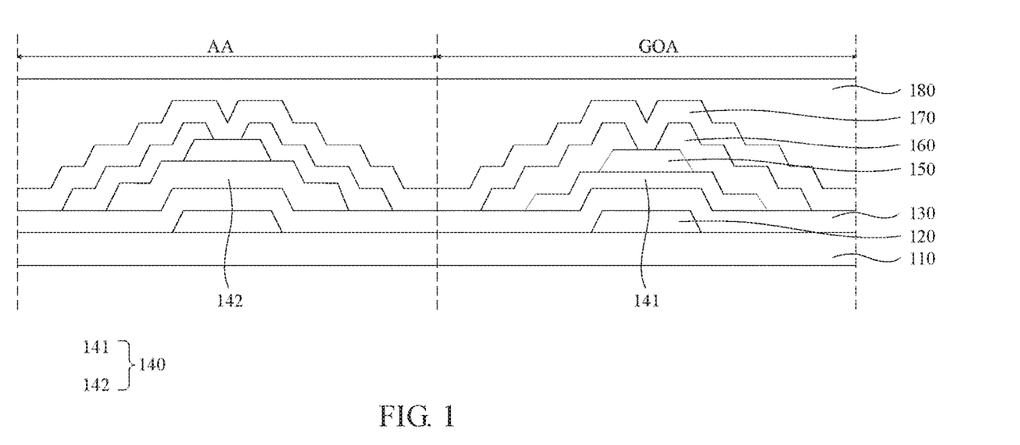
FIG. 1 is a schematic view of a first structure of an array substrate provided in one embodiment of the present invention.

In one embodiment, referring FIG. 1, the micro-LED chip 10 provided in the present invention includes the following components that are disposed in order from top to bottom:

a buffer layer 101; in one embodiment, the buffer layer 101 is a relatively thick intrinsic layer of gallium nitride, which has a thickness greater than 2 μm; this embodiment is only for exemplary description and should not be considered as a limitation;

a first semiconductor layer 102, an active layer 103, and a second semiconductor layer 104; in one embodiment, the first semiconductor layer 102 is an N-type gallium nitride layer, the active layer 103 is a gallium nitride multi-quantum well layer, and the second semiconductor layer 104 is a P-type gallium nitride layer, in which the P-type gallium nitride layer may be a magnesium (Mg) doped gallium nitride layer, the N-type gallium nitride layer may be a silicium (Si) doped gallium nitride layer, and the gallium nitride quantum well layer may be an indium gallium nitride/gallium nitride (InGaN/GaN) layer that is stacked sequentially and repeatedly; this embodiment is only for exemplary description and should not be considered as a limitation, and in other embodiments, the materials of the first semiconductor layer 102, the active layer 103, and the second semiconductor layer 104 may be selected based on the actual needs for the micro-LED chip;

an insulating layer 105, which is configured to separate the first semiconductor layer 102, the active layer 103, and the second semiconductor layer 104 into at least two independent sub-chips; in one embodiment, the material of the insulating layer 105 includes one or more of silicon nitride, silicon oxynitride, aluminum nitride, a coated glass, and polyimide, preferably silicon nitride with good photopermeability;

a current diffusion layer 106, which is configured to connect the second semiconductor layer 104 in each sub-chip with the first semiconductor layer 102 in the next sub-chip to form ohmic contact, such that the hole generated in a P-type semiconductor layer and/or electrons generated in a N-type semiconductor layer may be effectively injected into the active layer, thereby increasing the luminous efficiency of the micro-LED display panel; also, the current diffusion layer 106 plays a role of reflecting light; in one embodiment, the material of the current diffusion layer 106 includes those having good conductivity and reflective property, such as graphene, indium tin oxide, zinc oxide, nickel, silver, aluminum, gold, platinum, palladium, magnesium, tungsten, etc.; further, the current diffusion layer 106 may have a single-layer structure or a multilayer structure;

a protective layer 107, which is configured to cover and isolate the current diffusion layer 106, and also isolate water, oxygen, and heat conduction, so as to slow down the performance degradation of each layer in the micro-LED chip 10, and thus prolonging the service life of the micro-LED chip; in one embodiment, the material of the protective layer 107 includes one of silicon oxide, silicon nitride, silicon oxynitride, or aluminum nitride, preferably one of silicon nitride, silicon oxynitride, or aluminum nitride with good thermal conductivity; and a first electrode 108 and a second electrode 109, in which the first electrode 108 is electrically connected to the first semiconductor layer 102 of the first sub-chip, and the second electrode 109 is electrically connected to the second semiconductor layer 104 of the last sub-chip; in one embodiment, the first electrode 108 is an N-type electrode, the second electrode 109 is a P-type electrode, and their materials include one or more of indium, tin, zinc, nickel, silver, aluminum, gold, platinum, palladium, magnesium, tungsten, and an alloy thereof; further, they may have a single-layer metal structure or a multi-layer metal structure.

In each sub-chip, the N-type semiconductor layer 102, the active layer 103, and the P-type semiconductor layer 104 constitute a light-emitting PN junction. When the light-emitting PN junction is connected to an external circuit to allow voltage to be applied to the light-emitting PN junction through the external circuit, electrons are generated in the N-type semiconductor layer 102 and the P-type semiconductor layer 104, resulting in problems in the conventional display panels that the negative bias of the array substrate in the display area shall be prevented, and the response time of the array substrate in the GOA area shall be improved. The present invention provides an array substrate and a method of manufacturing thereof to solve such problems.

Figure 2:
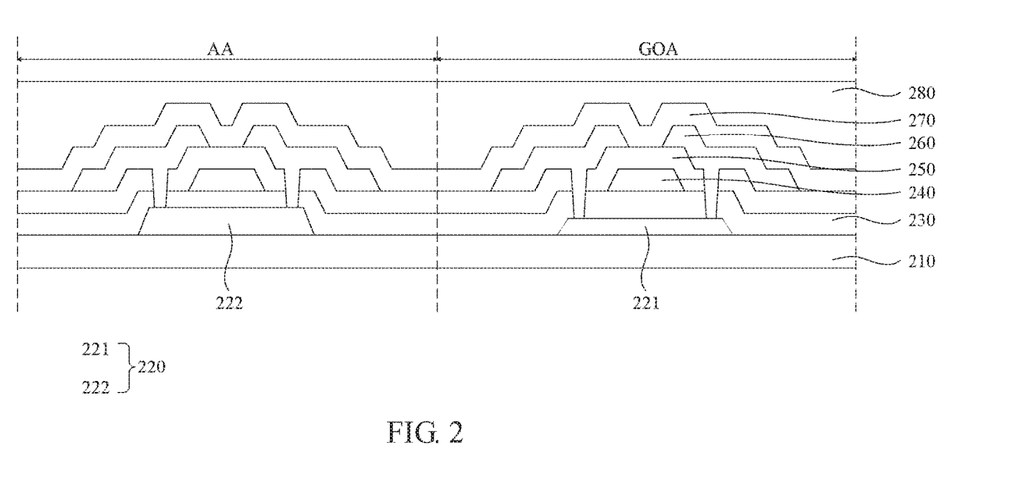
FIG. 2 is the schematic view of the first structure of the array substrate provided in the embodiment of the present invention.

In one embodiment, referring to FIGS. 1 and 2, the array substrate provided in the present invention includes a display area AA and a GOA area, and the array substrate also includes:

a substrate;

an active layer formed on the substrate and patterned to form an active area; and a source drain layer formed on the active layer;

in which a thickness of the active area in the display area is greater than a thickness of the active area in the GOA area.

This embodiment provides an array substrate, in which the array substrate includes a display area and a GOA area. In the array substrate, a thickness of an active layer in the AA area is greater than a thickness of the active layer in the GOA area. In the array substrate, the thicknesses of the active layer in the GOA area and in the display area are different; more specifically, the lesser thickness of the active layer in the GOA area achieves the improved response time of thin film transistor in the GOA area, and the greater thickness of the active layer in the display area reduces the diffusion of photons in the active layer, so as to decrease the influence of negative bias of thin film transistor in the display area. By the different thicknesses of the active layer in the GOA area and in the display area, the different demands for the characteristics of the array substrate in the display area and in the GOA area may be met, such that the quality of the display panel is improved.

In one embodiment, referring to FIG. 1, the array substrate provided in the present invention has a bottom gate structure, and the array substrate includes:

a substrate 110, in which the substrate 110 is a glass substrate or a flexible substrate; the glass substrate consists of aluminosilicate and other components, and has properties such as low alkali, high flatness, high temperature resistance, and low coefficient of thermal expansion; the flexible substrate generally includes a first substrate, a second substrate, and an inorganic layer disposed between the first substrate and the second substrate, in which the materials of the first substrate and the second substrate include polyacetamide or polyethylene terephthalate for providing flexibility to the flexible substrate; and the material of the inorganic layer includes silicon nitride or silicon oxide for preventing water or oxygen outside the array substrate from entering the thin film transistor;

a gate layer 120 formed on the substrate 110 and patterned to form a gate and a scanning signal trace, in which the material of the gate layer 120 is generally metal molybdenum, metal aluminum, or aluminum alloy;

a gate insulating layer 130 formed on the gate layer 120 and covering the gate layer 120 and the substrate 110, in which the gate insulating layer is generally a stack structure formed by silicon oxide/silicon nitride; silicon nitride has a high breakdown voltage and thus may be used as a good gate insulation material; the surfaces of silicon oxide and polysilicon have good grain boundary matching and stress matching; and silicon oxide has good step coverage;

an active layer 140 formed on the gate insulating layer 130 and patterned to form an active area, in which the active area is doped to form a doped area and a channel area; in one embodiment of the present invention, the material of the active layer is indium gallium zinc oxide or amorphous silicon; and the doped area is doped with phosphorus ion in a high concentration to form a source drain area of an N-type thin film transistor, or doped with boron ion in a high concentration to form a source drain area of a P-type thin film transistor;

the active layer includes an active area 141 in the GOA area and an active area 142 in the AA area, in which the thickness of the active area 141 is less than the thickness of the active area 142; the thicknesses of the active layer in the GOA area and in the display area are different; specifically, the lesser thickness of the active layer in the GOA area achieves the improved response time of thin film transistor in the GOA area, and the greater thickness of the active layer in the display area reduces the diffusion of photons in the active layer, so as to decrease the influence of negative bias of thin film transistor in the display area; by the different thicknesses of the active layer in the GOA area and in the display area, the different demands for the characteristics of the array substrate in the display area and in the GOA area may be met, such that the quality of the display panel is improved;

an etch stop layer 150 formed on the active layer 140 and covering the channel area of the active layer 140, or covering both of the channel area and the doped area, in which the material of the etch stop layer is silicon oxide, silicon nitride, or a stack structure of silicon oxide and silicon nitride; and the etch stop layer 150 is configured to protect the channel area of the active layer 140 from erosion due to the etching solution during the subsequent manufacturing of the source drain layer;

a source drain layer 160 formed on the etch stop layer 150 and patterned to form a source, a drain, a data signal trace, and a power signal trace, in which the source and the drain are connected to the doped areas disposed at two sides of the active area, respectively; and the material of the source drain layer 160 is a stack structure of titanium/aluminum/titanium, or a stack structure of molybdenum/aluminum/molybdenum;

a passivation layer 170 formed on the source drain layer 160 and covering the source drain layer 160, the etch stop layer 150, and the gate insulating layer 130, in which the passivation layer 170 is configured to mainly separate the source, the drain, the data signal trace, and the power signal trace in the source drain layer, so as to prevent short-circuiting between them, and also configured to make the source drain layer be insulated from a metal layer disposed thereon; and the material of the passivation layer 170 is generally silicon nitride; and a planarization layer 180 formed on the passivation layer 170 and covering the passivation layer 170, in which the planarization layer 180 is configured to mainly planarize the array substrate; and the material of the planarization layer 180 is generally polyimide (PI), polyethylene terephthalate (PET), or other organic materials.

Since the thickness of the active layer 141 in the GOA area is greater than the thickness of the active layer 142 in the AA area, it is easy to cause the overall thickness of the array substrate in the GOA area to be greater than the overall thickness of the array substrate in the AA area. In order to ensure that the overall thickness of the array substrate in the GOA area is equal to that of the array substrate in the AA area, it is necessary to adjust the thicknesses of other functional layers.

In one embodiment, the thickness of the passivation layer in the AA area is less than the thickness of the passivation layer in the GOA area. The sum of the thicknesses of the active layer and the passivation layer in the AA area is equal to the sum of the thicknesses of the active layer and the passivation layer in the GOA area, thereby decreasing the influence of the difference in the thicknesses of the active area in the GOA area and the AA area on the overall thickness of the array substrate.

In another embodiment, the thickness of the planarization layer in the AA area is less than the thickness of the planarization layer in the GOA area. The sum of the thicknesses of the active layer and the planarization layer in the AA area is equal to the sum of the thicknesses of the active layer and the planarization layer in the GOA area, thereby decreasing the influence of the difference in the thicknesses of the active area in the GOA area and the AA area on the overall thickness of the array substrate.

In another embodiment, referring to FIG. 2, the array substrate provided in the present invention has top gate structure, and the array substrate includes:

a substrate 210, in which the substrate 210 is a glass substrate or a flexible substrate; the glass substrate consists of aluminosilicate and other components, and has properties such as low alkali, high flatness, high temperature resistance, and low coefficient of thermal expansion; the flexible substrate generally includes a first substrate, a second substrate, and an inorganic layer disposed between the first substrate and the second substrate, in which the materials of the first substrate and the second substrate are polyacetamide or polyethylene terephthalate for providing flexibility to the flexible substrate; and the material of the inorganic layer is silicon nitride or silicon oxide for preventing water or oxygen outside the array substrate from entering the thin film transistor;

an active layer 220 formed on the substrate 210 and patterned to form the active area, in which the active area is doped to form a doped area and a channel area; in one embodiment of the present invention, the material of the active layer is indium gallium zinc oxide or amorphous silicon; and the doped area is doped with phosphorus ion in a high concentration to form a source drain area of an N-type thin film transistor, or doped with boron ion in a high concentration to form a source drain area of a P-type thin film transistor;

the active layer includes an active area 221 in the GOA area and an active area 222 in the AA area, in which the thickness of the active area 221 is less than the thickness of the active area 222; the thicknesses of the active layer in the GOA area and in the display area are different; specifically, the lesser thickness of the active layer in the GOA area achieves the improved response time of thin film transistor in the GOA area, and the greater thickness of the active layer in the display area reduces the diffusion of photons in the active layer, so as to decrease the influence of negative bias of thin film transistor in the display area; by the different thicknesses of the active layer in the GOA area and in the display area, the different demands for the characteristics of the array substrate in the display area and in the GOA area may be met, such that the quality of the display panel is improved;

a gate insulating layer 230 formed on the active layer 220 and covering the active layer 220 and the substrate 210, in which the gate insulating layer is generally a stack structure formed by silicon oxide/silicon nitride; silicon nitride has a high breakdown voltage and thus may be used as a good gate insulation material; the surfaces of silicon oxide and polysilicon have good grain boundary matching and stress matching; and silicon oxide has good step coverage;

a gate layer 240 formed on the gate insulating layer 230 and patterned to form a gate and a scanning signal trace, in which the material of the gate layer 240 is generally metal molybdenum, metal aluminum, or aluminum alloy;

an interlayer insulation layer 250 formed on the gate layer 240 and covering the gate layer 240 and the gate insulating layer 230, in which the material of the interlayer insulation layer is silicon oxide, silicon nitride, or a stack structure of silicon oxide and silicon nitride;

a source drain layer 260 formed on the interlayer insulation layer 250 and patterned to form a source, a drain, a data signal trace, and a power signal trace, in which the source and the drain are connected to the doped areas respectively disposed at two sides of the active area; and the material of the source drain layer 260 is a stack structure of titanium/aluminum/titanium, or a stack structure of molybdenum/aluminum/molybdenum;

a passivation layer 270 formed on the source drain layer 260 and covering the source drain layer 260 and the interlayer insulation layer 250, in which the passivation layer 270 is configured to mainly separate the source, the drain, the data signal trace, and the power signal trace in the source drain layer to prevent short-circuiting between them, and also to make the source drain layer be insulated from a metal layer disposed thereon; and the material of the passivation layer 270 is generally silicon nitride; and a planarization layer 280 formed on the passivation layer 270 and covering the passivation layer 270, in which the planarization layer 280 is configured to mainly planarize the array substrate; and the material of the planarization layer 280 is generally polyimide (PI), polyethylene terephthalate (PET), or other organic materials.

Since the thickness of the active layer 221 in the GOA area is greater than the thickness of the active layer 222 in the AA area, it is easy to cause the overall thickness of the array substrate in the GOA area to be greater than the overall thickness of the array substrate in the AA area. In order to ensure that the overall thickness of the array substrate in the GOA area is equal to that of the array substrate in the AA area, it is necessary to adjust the thicknesses of other functional layers.

In one embodiment, the thickness of the interlayer insulation layer in the AA area is less than the thickness of the interlayer insulation layer in the GOA area. The sum of the thicknesses of the active layer and the interlayer insulation layer in the AA area is equal to the sum of the thicknesses of the active layer and the interlayer insulation layer in the GOA area, thereby decreasing the influence of the difference in the thicknesses of the active area in the GOA area and the AA area on the overall thickness of the array substrate.

In another embodiment, the thickness of the passivation layer in the AA area is less than the thickness of the passivation layer in the GOA area. The sum of the thicknesses of the active layer and the passivation layer in the AA area is equal to the sum of the thicknesses of the active layer and the passivation layer in the GOA area, thereby decreasing the influence of the difference in the thicknesses of the active area in the GOA area and the AA area on the overall thickness of the array substrate.

In yet another embodiment, the thickness of the planarization layer in the AA area is less than the thickness of the planarization layer in the GOA area. The sum of the thicknesses of the active layer and the planarization layer in the AA area is equal to the sum of the thicknesses of the active layer and the planarization layer in the GOA area, thereby decreasing the influence of the difference in the thicknesses of the active area in the GOA area and the AA area on the overall thickness of the array substrate.

Figure 3:
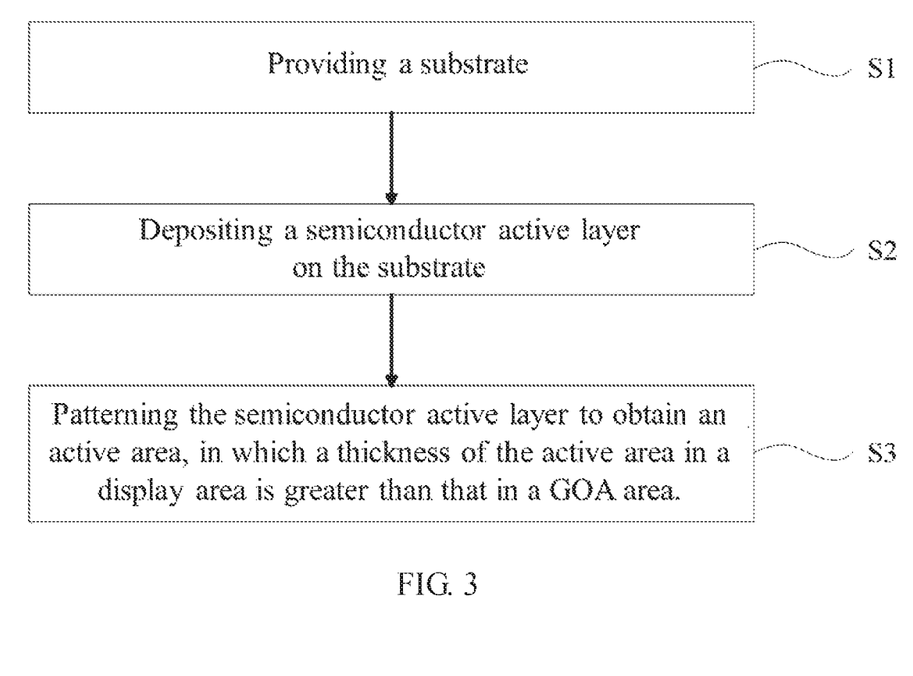
FIG. 3 is a preparation flow diagram of an array substrate provided in one embodiment of the present invention.

In one embodiment, referring to FIG. 3, the present invention provides a method of manufacturing an array substrate, including:

S1: providing a substrate;

S2: depositing a semiconductor active layer on the substrate; and

S3: patterning the semiconductor active layer to obtain an active area, in which a thickness of the active area in a display area is greater than a thickness of the active area in a GOA area.

This embodiment provides a method of manufacturing an array substrate. In the array substrate, the thicknesses of the active layer in the GOA area and in the display area are different by the patterning process in the manufacturing method; more specifically, the lesser thickness of the active layer in the GOA area achieves the improved response time of thin film transistor in the GOA area, and the greater thickness of the active layer in the display area reduces the diffusion of photons in the active layer, so as to decrease the influence of negative bias of thin film transistor in the display area. By the different thicknesses of the active layer in the GOA area and in the display area, the different demands for the characteristics of the array substrate in the display area and in the GOA area may be met, such that the quality of the display panel is improved.

In one embodiment, the semiconductor active layer is patterned and obtained by a half-tone lithography process.

Figure 4:
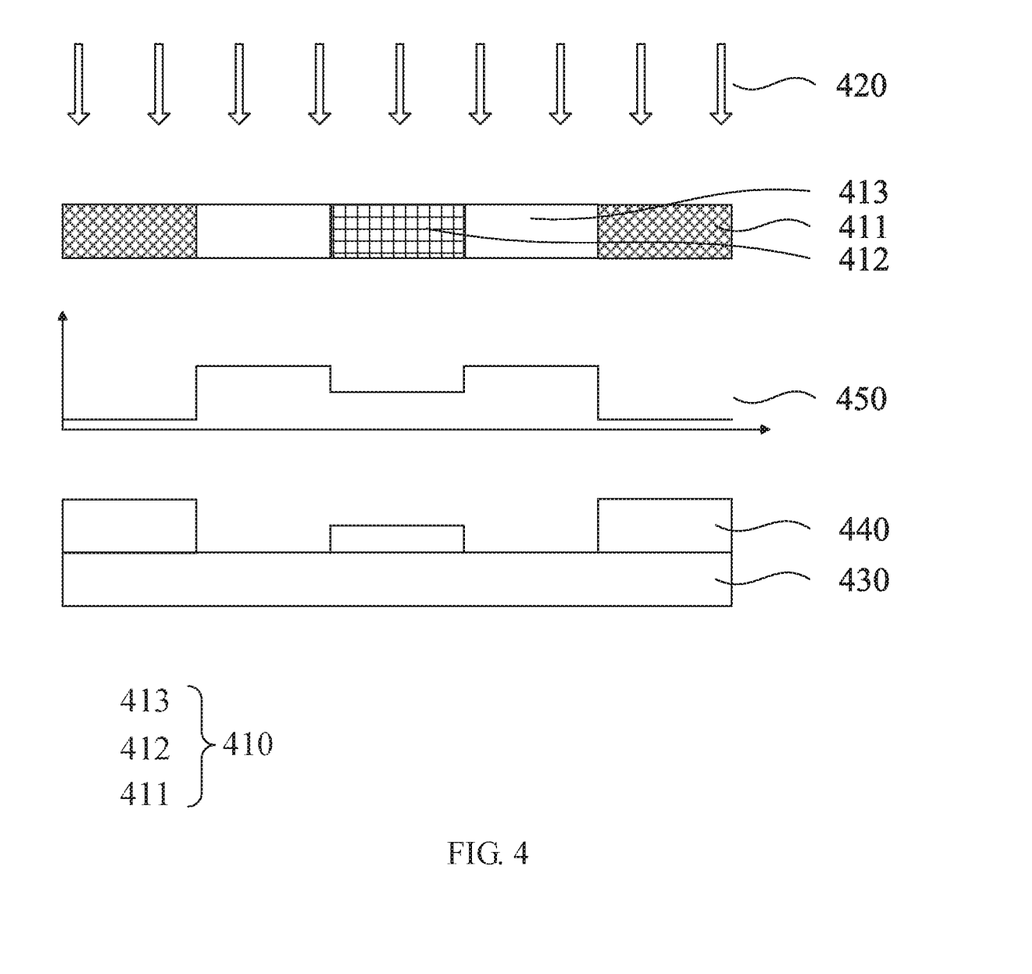
FIG. 4 is a schematic view showing a principle of a half-tone lithography process provided in one embodiment of the present invention.

Referring to FIG. 4, it shows a schematic view of a principle of a half-tone lithography process. A half-tone mask 410 includes an opaque area 411, a semi-transparent area 412, and a fully-transparent area 413. When light 420 passes through the half-tone mask 410 and irradiates a photoresist 440 on a substrate 430, the light intensity of the light 420 passing through the half-tone mask 410 is shown as a curve 450.

When the exposure irradiation light 420 irradiates the fully-transparent area 413, the exposure irradiation light passes through the half-tone mask and reaches the photoresist without any blockage. At this time, the intensity of the exposure irradiation light received by the photoresist in this corresponding area is the strongest. The photoresist in this corresponding area is exposed and developed, and then the photoresist is practically removed due to polymerization.

When the exposure irradiation light 420 irradiates the opaque area 411, the exposure irradiation light is practically blocked by the opaque area 411 and cannot pass through the half-tone mask to reach the photoresist. At this time, the intensity of the exposure irradiation light received by the photoresist in this corresponding area is nearly zero. The photoresist in this corresponding area is exposed and developed, and then the photoresist is practically retained.

When the exposure irradiation light 420 irradiates the semi-transparent area 412, the exposure irradiation light partly passes through the semi-transparent area 412 to reach the photoresist. At this time, the intensity of the exposure irradiation light received by the photoresist in this corresponding area is reduced. The photoresist in this corresponding area is exposed and developed, and then the photoresist is partly removed due to polymerization, and the remaining photoresist is retained.

Accordingly, by the half-tone lithography process, the photoresist is exposed and developed and two patterns of photoresist with different thicknesses may be obtained, such that the array substrate in which the thicknesses of the active layer in the GOA area and in the display area are different may be manufactured.

The method of manufacturing an array substrate by the half-tone lithography process provided in the present invention is described as follows.

S401: providing a substrate.

In order to prevent harmful substances, such as alkali metal ions and other impurities, from impacting the performance of the polysilicon thin film, the provided substrate needs to be cleaned.

S402: forming a gate layer on the substrate.

A metal thin film is sputtered onto the substrate by using a magnetron sputtering process. The metal thin film may be metal molybdenum, metal aluminum, or a composite material of metal molybdenum and metal aluminum.

After a lithography process, a gate and a gate line are formed. A photoresist layer is deposited on the thin film of metallic molybdenum. The photoresist layer is then exposed by using a set of gate masks. Afterwards, the exposed photoresist is developed with a developing solution to obtain a pattern of gate layer. Further, the exposed gate layer of metal molybdenum is subjected to wet etching to remove the metal molybdenum without protection of the photoresist. Further, the remaining photoresist is removed. The remaining metal layer is a patterned gate layer.

S403: forming a gate insulating layer on the gate layer.

An insulating material is deposited on the gate layer by ion chemical vapor deposition. The insulating material may be a single-layer of silicon nitride film, a single-layer of silicon oxide film, or a stack layer of silicon oxide/silicon nitride. The gate insulating layer needs to have a higher dielectric constant, such that the capacitance of gate oxide layer (i.e., capacitance between the gate and the channel area of the active layer) is greater, and it is easier to generate a channel inversion layer.

S404: forming an active layer on the gate insulating layer.

A semiconductor active layer is deposited on the gate insulating layer by ion chemical vapor deposition. The active layer may be an oxide active layer or an active layer of amorphous silicon.

The active layer is subjected to a patterning process.

A layer of photoresist is coated on the active layer and exposed with a half-tone mask. The semi-transparent area of the half-tone mask corresponds to the active area in the display area, and the opaque area of the half-tone mask corresponds to the active area in the GOA area.

The exposed photoresist is developed to remove the photoresist that is completely irradiated, such that the photoresist that is not irradiated by light or is irradiated by half-tone light is retained. The thickness of the photoresist that is not irradiated by light is greater than the thickness of the photoresist that is irradiated by half-tone light.

The active layer without the photoresist protection is etched by a first etching process, such that the remaining active layer is the active area protected by the photoresist.

The photoresist is subjected to a plasma ashing process to remove the photoresist that is irradiated by half-tone light, such that the photoresist that is not irradiated by light is remained.

The active layer without the photoresist protection is etched by a second etching process, and the etching process is controlled, such that the active area is thinned and retained.

The remaining photoresist is subjected to a plasma ashing process to strip off the remaining photoresist.

So far, the patterning process of the active layer is completed, and an active area that is thinned in the GOA area and is not thinned in the display area is obtained.

The patterned active area is subjected to a doping process. The ion doping is performed on a predetermined position of the active region by ion bath or ion implantation through a self-alignment process. The doped ion may be phosphorus ion in a high concentration, and a source drain area of an N-type thin film transistor is formed; alternatively, the doped ion may be boron ion in a high concentration, and a source drain area of a P-type thin film transistor is formed.

S405: forming an etch stop layer on the active layer.

A thin film of silicon oxide is deposited on the active layer by ion chemical vapor deposition, which is used as an etch stop layer. The etch stop layer covers the active area of the active layer, and also covers a part of the doped area of the active layer.

S406: forming a source drain layer on the etch stop layer.

Before a source drain layer is formed, a via hole needs to be formed at a predetermined position of the array substrate, in which the via hole is configured to connect the active layer, the gate layer, and the source drain layer during the process of deposing source drain metal. The used process is dry etching, including reactive ion etching and inductively coupled plasma etching.

After the via hole is formed, a thin film of indium tin oxide is sputtered onto the etch stop layer by using a magnetron sputtering process. The reason for depositing the thin film of indium tin oxide under the action of a strong magnetic field is mainly that a high power sputtering process is not suitable for sputtering the thin film of indium tin oxide. Under the high power condition, the target of indium tin oxide will be impacted by argon ions with high energy, resulting in indium oxide on the surface of the target of indium tin oxide. The indium oxide has poor conductivity and affects the self-sustained discharge. In addition, the temperature used in the process of sputtering the substrate by magnetron is less than 100° C., such that the formed thin film of indium tin oxide is amorphous and has high etching rate, and will not leave residue.

The thin film of indium tin oxide is patterned by one lithography process to form a source, a drain, a data signal trace, and a power signal trace.

S407: forming a passivation layer on the source drain layer.

An insulating material is deposited on the source drain layer by ion chemical vapor deposition to form a passivation layer. The insulating material may be a single-layer of silicon nitride film, a single-layer of silicon oxide film, or a stack layer of silicon oxide/silicon nitride. The passivation layer covers the source drain layer and the interlayer insulation layer.

S408: forming a planarization layer on the passivation layer.

An organic material is coated on the passivation layer to planarize the array substrate. The organic material is generally polyimide, polyethylene terephthalate, or other organic materials.

In another embodiment, the semiconductor active layer is patterned and obtained by a gray-tone mask process.

Figure 5:
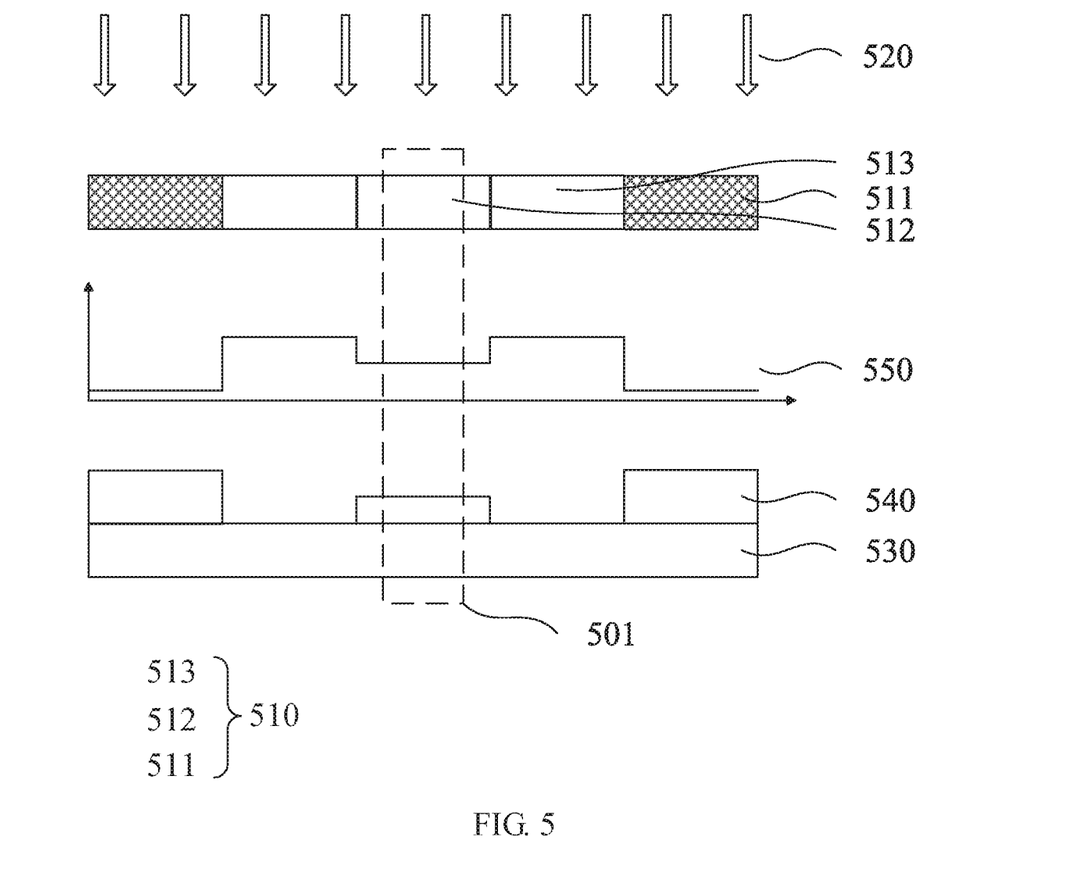
FIG. 5 is a schematic view showing a principle of a gray-tone mask process provided in one embodiment of the present invention.

Referring to FIG. 5, it shows a schematic view of a principle of a gray-tone mask process. The gray-tone mask process achieves the half-tone mask by grating effect, thereby making the photoresist be selectively exposed and developed. A gray-tone mask 510 includes an opaque area 511, a grating area 512, and a fully-transparent area 513. When light 520 passes through the half-tone mask 510 and irradiates a photoresist 540 on a substrate 530, the light intensity of the light 520 passing through the half-tone mask 510 is shown as a curve 550.

When the exposure irradiation light 520 irradiates the fully-transparent area 513, the exposure irradiation light passes through the half-tone mask and reaches the photoresist without any blocking. At this time, the intensity of the exposure irradiation light received by the photoresist in this corresponding area is the strongest. The photoresist in this corresponding area is exposed and developed, and then the photoresist is practically removed due to polymerization.

When the exposure irradiation light 520 irradiates the opaque area 511, the exposure irradiation light is practically blocked by the opaque area 511 and cannot pass through the half-tone mask to reach the photoresist. At this time, the intensity of the exposure irradiation light received by the photoresist in this corresponding area is nearly zero. The photoresist in this corresponding area is exposed and developed, and then the photoresist is practically retained.

Figure 6:
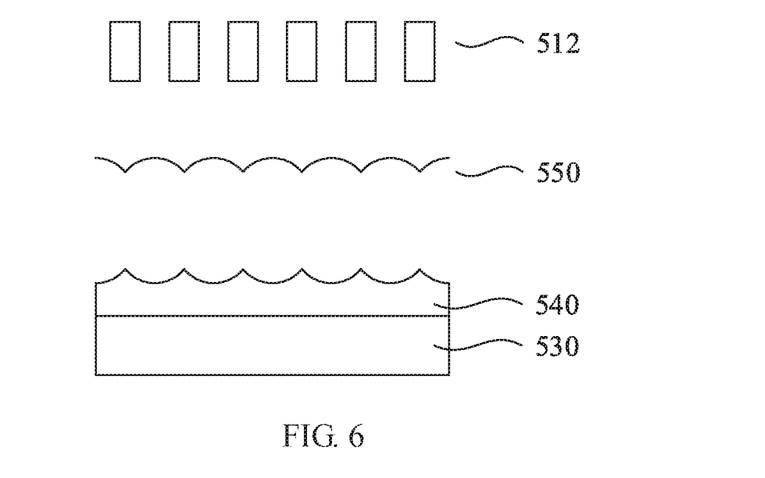
FIG. 6 is an enlarged partial schematic view of region 501 in FIG. 5.

Referring to FIG. 6, when the exposure irradiation light 520 irradiates the semi-transparent area 512, the exposure irradiation light partly passes through the hollow area of the grating to reach the photoresist, and is partly blocked by the grating. At this time, the intensity of the exposure irradiation light received by the photoresist in this corresponding area is reduced, but some energy is still retained. The photoresist in this corresponding area is exposed and developed, and then the photoresist is partly removed due to polymerization, and the remaining photoresist is retained.

Accordingly, by the gray-tone mask process, the photoresist is exposed and developed and two patterns of photoresist with different thicknesses may be obtained, such that the array substrate in which the thicknesses of the active layer in the GOA area and in the display area are different may be manufactured. The specific manufacturing method of the gray-tone mask process may refer to the manufacturing method of the half-tone lithography process described in the above embodiments, and is not described herein again.

Also, the present invention further provides a display panel including an array substrate, in which the array substrate includes a display area and a GOA area. The array substrate includes:

a substrate;

an active layer formed on the substrate and patterned to form an active area; and a source drain layer formed on the active layer;

in which a thickness of the active area in a display area is greater than a thickness of the active area in the GOA area.

This embodiment provides a display panel including an array substrate. The array substrate includes a display area and a GOA area. In the array substrate, a thickness of the active layer in the AA area is greater than a thickness of the active layer in the GOA area. In the array substrate, the thicknesses of the active layer in the GOA area and in the display area are different; more specifically, the lesser thickness of the active layer in the GOA area achieves the improved response time of thin film transistor in the GOA area, and the greater thickness of the active layer in the display area reduces the diffusion of photons in the active layer, so as to decrease the influence of negative bias of thin film transistor in the display area. By the different thicknesses of the active layer in the GOA area and in the display area, the different demands for the characteristics of the array substrate in the display area and in the GOA area may be met, such that the quality of the display panel may be improved.

In one embodiment, the array substrate further includes a substrate, a gate layer, a gate insulating layer, an etch stop layer, a source drain layer, a passivation layer, and a planarization layer, and the active layer is disposed between the gate insulating layer and the etch stop layer.

In one embodiment, the thickness of the array substrate in the display area is equal to the thickness of the array substrate in the GOA area.

In one embodiment, the thickness of the passivation layer in the display area is less than the thickness of the passivation layer in the GOA area.

In one embodiment, the thickness of the planarization layer in the display area is less than a thickness of the planarization layer in the GOA area.

In one embodiment, the array substrate further includes a substrate, a gate an insulating layer, a gate layer, an interlayer insulation layer, a source drain layer, a passivation layer, and a planarization layer, and the active layer is disposed between the substrate and the gate insulating layer.

In one embodiment, the thickness of the array substrate in the display area is equal to the thickness of the array substrate in the GOA area.

In one embodiment, the thickness of the interlayer insulation layer in the display area is less than the thickness of the interlayer insulation layer in the GOA area.

In one embodiment, the thickness of the passivation layer in the display area is less than the thickness of the passivation layer in the GOA area.

In one embodiment, the thickness of the planarization layer in the display area is less than a thickness of the planarization layer in the GOA area.

According to the above embodiments, the present invention provides an array substrate, a method of manufacturing thereof, and a display panel. The array substrate includes a display area and a GOA area. In the array substrate, a thickness of an active layer in the AA area is greater than a thickness of the active layer in the GOA area. In the array substrate, the thicknesses of the active layer in the GOA area and in the display area are different; more specifically, the lesser thickness of the active layer in the GOA area achieves the improved response time of thin film transistor in the GOA area, and the greater thickness of the active layer in the display area reduces the diffusion of photons in the active layer, so as to decrease the influence of negative bias of thin film transistor in the display area. By the different thicknesses of the active layer in the GOA area and in the display area, the different demands for the characteristics of the array substrate in the display area and in the GOA area may be met, such that the quality of the display panel may be improved.

From the above, although the present invention has been disclosed by the preferred embodiments as above, the preferred embodiments should not be considered as limitations to the present invention. Those skilled persons in the art may change and modify the present invention without departing from the spirit and scope of the present invention. Hence, the scope of the present invention is determined by claims.

What is claimed is:

1. An array substrate comprising a display area and a gate driver on array (GOA) area, comprising:
    a substrate;
    an active layer formed on the substrate and patterned to form an active area; and
    a source drain layer formed on the active layer;
    wherein a thickness of the active area in the display area is greater than a thickness of the active area in the GOA area; and
    wherein a material of the source drain layer is a stack structure of titanium/aluminum/titanium or a stack structure of molybdenum/aluminum/molybdenum, and wherein a thickness of the source drain layer in the display area is less than a thickness of the source drain layer in the GOA area.

2. The array substrate according to claim 1, further comprising a gate layer, a gate insulating layer, an etch stop layer, a passivation layer, and a planarization layer which are stacked on the substrate, wherein the active layer is disposed between the gate insulating layer and the etch stop layer, and the source drain layer is disposed between the etch stop layer and the passivation layer.

3. The array substrate according to claim 2, wherein a thickness of the array substrate in the display area is equal to a thickness of the array substrate in the GOA area.

4. The array substrate according to claim 3, wherein a thickness of the passivation layer in the display area is less than a thickness of the passivation layer in the GOA area.

5. The array substrate according to claim 3, wherein a thickness of the planarization layer in the display area is less than a thickness of the planarization layer in the GOA area.

6. The array substrate according to claim 1, further comprising a gate insulating layer, a gate layer, an interlayer insulation layer, a passivation layer, and planarization layer which are stacked on the substrate, wherein the active layer is disposed between the substrate and the gate insulating layer, and the source drain layer is disposed between the interlayer insulation layer and the passivation layer.

7. The array substrate according to claim 6, wherein a thickness of the array substrate in the display area is equal to a thickness of the array substrate in the GOA area.

8. The array substrate according to claim 7, wherein a thickness of the interlayer insulation layer in the display area is less than a thickness of the interlayer insulation layer in the GOA area.

9. The array substrate according to claim 7, wherein a thickness of the passivation layer in the display area is less than a thickness of the passivation layer in the GOA area.

10. The array substrate according to claim 7, wherein a thickness of the planarization layer in the display area is less than a thickness of the planarization layer in the GOA area.

11. The array substrate according to claim 1, wherein in the GOA area, a material of the active layer of the array substrate comprises amorphous silicon or indium gallium zinc oxide.

12. A method of manufacturing an array substrate, comprising:
    providing a substrate;
    depositing a semiconductor active layer on the substrate; and
    patterning the semiconductor active layer to obtain an active area, wherein a thickness of the active area in a display area is greater than a thickness of the active area in a gate driver on array (GOA) area; and wherein a material of the source drain layer is a stack structure of titanium/aluminum/titanium or a stack structure of molybdenum/aluminum/molybdenum, and wherein a thickness of the source drain layer in the display area is less than a thickness of the source drain layer in the GOA area.

13. The method according to claim 12, wherein the step of patterning the semiconductor active layer further comprises patterning the semiconductor active layer by a half-tone lithography process.

14. The method according to claim 12, wherein the step of patterning the semiconductor active layer further comprises patterning the semiconductor active layer by a gray-tone mask process.

15. A display panel, comprising an array substrate, wherein the array substrate comprises a display area and a gate driver on array (GOA) area, and a thickness of an active layer in the display area is greater than a thickness of the active layer in the GOA area; and wherein a material of the source drain layer is a stack structure of titanium/aluminum/titanium or a stack structure of molybdenum/aluminum/molybdenum, and wherein a thickness of the source drain layer in the display area is less than a thickness of the source drain layer in the GOA area.

16. The display panel according to claim 15, wherein the array substrate further comprises a gate layer, a gate insulating layer, an etch stop layer, a passivation layer, and a planarization layer which are stacked on the substrate, the active layer is disposed between the gate insulating layer and the etch stop layer, and the source drain layer is disposed between the etch stop layer and the passivation layer.

17. The display panel according to claim 16, wherein a thickness of the array substrate in the display area is equal to a thickness of the array substrate in the GOA area.

18. The display panel according to claim 17, wherein a thickness of the passivation layer in the display area is less than a thickness of the passivation layer in the GOA area.

19. The display panel according to claim 15, wherein the array substrate further comprises a gate insulating layer, a gate layer, an interlayer insulation layer, a passivation layer, and a planarization layer which are stacked on the substrate, the active layer is disposed between the substrate and the gate insulating layer, and the source drain layer is disposed between the interlayer insulation layer and the passivation layer.

20. The display panel according to claim 19, wherein a thickness of the array substrate in the display area is equal to a thickness of the array substrate in the GOA area.

* * * * *

UNITED STATES PATENT AND TRADEMARK OFFICE
CERTIFICATE OF CORRECTION

PATENT NO. : 11,289,517 B2
APPLICATION NO. : 16/626600
DATED : March 29, 2022
INVENTOR(S) : Suping Xi It is certified that error appears in the above-identified patent and that said Letters Patent is hereby corrected as shown below:

On the Title Page

Item (73) Assignee:
"Shenzhen China Star Optoelectronies Semiconductor Display Technology Co., Ltd."

Should be changed to:
-- Shenzhen China Star Optoelectronics Semiconductor Display Technology Co., Ltd. --

Signed and Sealed this
Twentieth Day of September, 2022

Katherine Kelly Vidal
*Director of the United States Patent and Trademark Office*